(12) United States Patent
Breitwisch et al.

(10) Patent No.: US 7,485,487 B1
(45) Date of Patent: Feb. 3, 2009

(54) PHASE CHANGE MEMORY CELL WITH ELECTRODE

(75) Inventors: Matthew J. Breitwisch, Yorktown Heights, NY (US); Roger W. Cheek, Somers, NY (US); Eric A. Joseph, White Plains, NY (US); Chung H. Lam, Peekskill, NY (US); Alejandro G. Schrott, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/970,207

(22) Filed: Jan. 7, 2008

(51) Int. Cl.
*H01L 21/00* (2006.01)
(52) U.S. Cl. ............................ 438/95; 257/3
(58) Field of Classification Search ............ 438/95; 257/3
See application file for complete search history.

(56) References Cited

U.S. PATENT DOCUMENTS

2007/0246748 A1* 10/2007 Breitwisch et al. .......... 257/246
2008/0061341 A1* 3/2008 Lung .......................... 257/303

* cited by examiner

*Primary Examiner*—Thao X Le
*Assistant Examiner*—Kimberly Trice
(74) *Attorney, Agent, or Firm*—Scully, Scott, Murphy & Presser, P.C.; Ido Tuchman, Esq.

(57) ABSTRACT

The present invention in one embodiment provides a method of forming a memory device including providing a first dielectric layer including at least one via containing a metal stud; providing a second dielectric layer atop the first dielectric layer; recessing the metal stud to expose a sidewall of the via; etching the sidewall of the via in the first dielectric layer with a isotropic etch step to produce an undercut region extending beneath a portion of the second dielectric layer; forming a conformal insulating layer on at least the portion of the second dielectric layer overlying the undercut region to provide a keyhole; etching the conformal insulating layer with an anisotropic etch to provide a collar that exposes the metal stud; forming a barrier metal within the collar in contact with the metal stud; and forming a phase change material in contact with the barrier metal.

17 Claims, 3 Drawing Sheets

PHASE CHANGE MEMORY CELL WITH ELECTRODE

FIELD OF THE INVENTION

The present invention in one embodiment relates to memory devices.

BACKGROUND OF THE INVENTION

In semiconductor and memory device applications, an electrode is a conductor through which electric current is passed. An electrode may be composed of a metal, such as copper, tungsten, silver, lead, or zinc. An electrode may also be in the form of a nonmetallic conductor, including a semiconducting material, such as doped polysilicon.

Phase change random access memory (PRAM) devices store data using a phase change material, such as, for example, a chalcogenide alloy, that transforms into a crystalline state or an amorphous state during cooling after a heat treatment. Each state of the phase change material has different resistance characteristics. Specifically, the phase change material in the crystalline state has low resistance and the phase change material in the amorphous state has high resistance. The crystalline state is typically referred to as a "set state" having a logic level "0", and the amorphous state is typically referred to as a "reset state" having a logic level "1". To form a reset state, a high current density pulse is applied to the phase change material through an electrode.

SUMMARY OF THE INVENTION

In one aspect, the present invention provides a method of forming a memory device. In one embodiment, the inventive method includes:

providing a first dielectric layer including at least one via containing a metal stud;

providing a second dielectric layer on the first dielectric layer, wherein an upper surface of the metal stud is exposed;

recessing the metal stud to expose a sidewall of the at least one via in the first dielectric layer;

etching the sidewall of the at least one via in the first dielectric layer by a substantially isotropic etch step to produce an undercut region extending beneath a portion of the second dielectric layer;

forming a conformal insulating layer on a recessed surface of the metal stud, the undercut region, and the portion of the second dielectric layer overlying the undercut region to provide a keyhole;

etching the conformal insulating layer with a substantially anisotropic etch, wherein the keyhole provides a mask to provide a collar that exposes the recessed surface of the metal stud;

forming a barrier metal within the collar in electrical contact with the metal stud to provide an electrode; and forming a phase change material in electrical contact with the electrode.

In one embodiment of the method of forming a memory device, the step of recessing the metal stud to expose the sidewall of the first dielectric layer includes an anisotropic etch process. In one embodiment, the anisotropic etch process includes a reactive ion etch process, wherein the etch chemistry removes the material of the metal stud selective to the second dielectric layer. In one embodiment, the metal stud is composed of tungsten (W), the second dielectric layer is composed of a nitride and the first dielectric layer is composed of an oxide.

In one embodiment, the step of selectively etching the sidewall of the first dielectric layer with a substantially isotropic etch step includes a wet etch process. In one embodiment, the isotropic etch removes the oxide composition of the first dielectric layer selective to a nitride composition of the second dielectric layer. In one embodiment, the length of the second dielectric layer overlying the undercut region that results from the isotropic etch step may range from about 5 nm to about 100 nm.

In one embodiment, the step of forming the conformal insulating layer includes depositing an oxide on at least the upper surface of the recessed metal stud, the undercut region in the first dielectric layer, and the portion of the second dielectric layer overlying the undercut. In one embodiment, the conformal insulating layer is composed of an oxide, such as $SiO_2$, that may be deposited by chemical vapor deposition or atomic layer deposition. In one embodiment, the conformal insulating layer is deposited to a thickness at the which the oxide formed on the edges of the second dielectric layer overlying the undercut region at opposing sides of the via contact one another to enclose a void that is hereafter referred to as a keyhole. In one embodiment of the present invention, in which the via width ranges from about 20 nm to about 500 nm, the conformal insulating layer has a thickness ranging from about 15 nm to about 300 nm.

In one embodiment, the step of selectively etching the conformal insulating layer with an anisotropic etch includes a reactive ion etch process. In one embodiment, the anisotropic etch step is continued until the portion of the oxide underlying the keyhole is removed to expose a portion of the recessed metal stud. The remaining portion of the conformal insulating layer positioned about the exposed portion of the recessed metal stud is hereafter referred to as a collar, wherein the sidewalls of the collar are the sidewalls of a cavity in which the electrode may be formed. In one embodiment, the collar may have sublithographic dimensions (typically less than 60 nm).

In one embodiment, the step of forming a barrier metal within the collar to provide the electrode includes chemical vapor deposition (CVD), atomic layer deposition (ALD) or physical vapor deposition (PVD), such as sputtering. In one embodiment, the barrier metal may be composed of TiN or TaN.

In one embodiment, the step of forming a phase change material includes depositing a phase change material composed of Ge, Sb, Te or a combination thereof atop the electrode. In one embodiment, forming a phase change material includes chemical vapor deposition (CVD) or physical vapor deposition (PVD).

In one embodiment, the method of the present invention further includes forming a second barrier metal layer on an upper surface of the phase change material. In one embodiment, the second barrier metal layer may be composed of TiN TaN, TaSiN, TiTaN, TaRuN or combinations thereof.

In another aspect of the present invention a memory device is provided. In one embodiment, the memory device includes:

a phase change material positioned within a via of an interlevel dielectric layer; and an electrode in contact with the phase change material, wherein the electrode has a sublithographic diameter.

In one embodiment of the memory device, the diameter of the electrode ranges from about 10 nm to about 50 nm. In one embodiment, the electrode is in electrical contact with the phase change material.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE INVENTION

Figure 1:
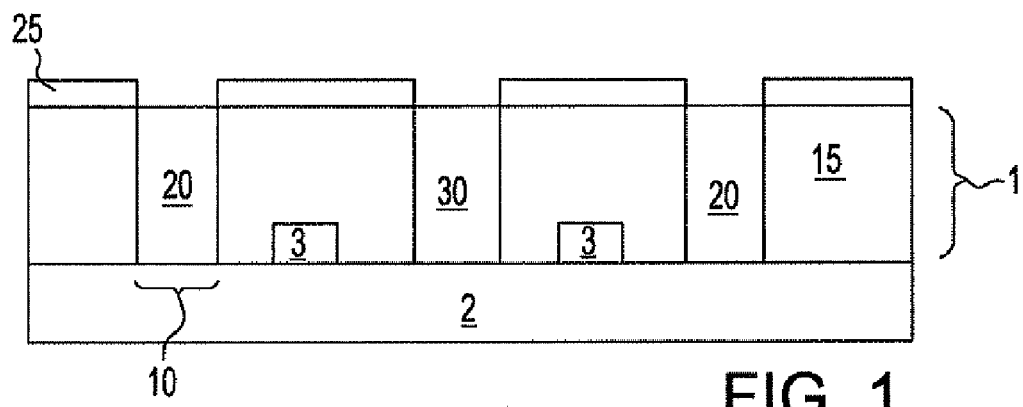
FIG. 1 is a side cross sectional view of an initial structure including an interconnect level having a first dielectric layer and conductive structures, such as a metal stud, extending through the first dielectric layer, as used in accordance with one embodiment of the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to novel memory devices and methods of forming memory devices. When describing the methods and structures, the following terms have the following meanings, unless otherwise indicated.

As used herein, an "anisotropic etch process" denotes a material removal process in which the etch rate in the direction normal to the surface to be etched is higher than in the direction parallel to the surface to be etched.

The term "isotropic etch process" means a material removal process in which the rate of the etching reaction is the same substantially in any direction.

As used herein, the term "memory device" means a structure in which the electrical state of which can be altered and then retained in the altered state; in this way a bit of information can be stored.

"Volatile memory" means memory in which stored information is lost when power to the memory cell is turned off.

"Non-volatile memory" means information stored is maintained after the power to the memory cell is turned off.

As used herein, the term "resistive memory device" denotes a device whose effective electrical resistivity can be switched between two or more resistivities (ohms) upon an application of an energy pulse, such as a voltage or current pulse. Pulse time may range from approximately 5 to approximately 1000 nano-seconds.

"Electrically conductive" and/or "electrically communicating" as used through the present disclosure means a material having a room temperature conductivity of greater than $10^{-8}\ (\Omega\text{-m})^{-1}$.

The term "electrical contact" denotes direct contact between two materials, wherein the interface between the two materials is electrically conductive.

As used herein, a "via" refers to a hole formed in a dielectric which is then filled with metal to provide vertical connection between stacked up interconnect metal lines and/or devices.

As used herein, a "metal stud" refers to the metal formed within a via.

As used herein, a "metal" is an electrically conductive material, wherein metal atoms are held together by the force of a metallic bond; and the energy band structure of metal's conduction and valence bands overlap, and hence, there is no energy gap.

The term "undercut region" denotes a material removal that extends underneath an overlying structure.

As used herein, the terms "insulating" and "dielectric" denote a non-metallic material that has a filled valence band at 0K and a band gap on the order of approximately 5 eV, wherein the room temperature conductivity is less than about $10^{-10}\ (\Omega\text{-m})^{-1}$.

As used herein, a "keyhole" is a cavity enclosed in an insulating material.

A "collar" is a sublithographic cavity that is formed of an insulating material and exposes a portion of an underlying structure.

The term "sublithographic" means less than 100 nm n.

As used herein, a "phase change material" denotes a material that converts from a first phase to a second phase upon the application of external energy.

As used herein, a "barrier metal" is a material used to chemically isolate the phase change material from metals and provides an electrical contact between them.

The term "electrode" denotes an electrically conductive material that applies external energy to a phase change material.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "tupper", "lower", "right", "left", "vertical", "horizontal", "top", "bottom", and derivatives thereof shall relate to the invention, as it is oriented in the drawing figures.

FIGS. 1 to 8 depict embodiments of the present method and structures relating thereto for forming a memory device, such as a phase change memory device, including a sublithographic contact electrode, which is self aligned with the lithographic feature, because the size reduction step does not require an additional mask.

FIG. 1 depicts one embodiment of an interconnect level 1 atop a substrate 2, such as a semiconducting wafer. In one embodiment, the present method may begin following front end of the line (FEOL) processing, in which an interconnect level 1 is provided that includes a first dielectric layer 15 having a plurality of openings 10 that are filled with at least one conductive material, such as a metal stud 20 or bar 30. In one embodiment, the first dielectric layer 15 may include a metal stud 20 that provides electrical conductivity to an access transistor (not shown) that is formed in the underlying substrate 2. In one embodiment, the first dielectric layer 15 may also include at least one metal bar 30, a conducting line, which may also provide electrical conductivity to an access transistor positioned in the underlying substrate 2. In one embodiment, the first dielectric layer 15 may further include a lower conductive line 3. The lower conductive line 3 may be a word line or a bit line.

The substrate 2 may include any number of active and/or passive devices (or regions) located within the substrate 2 or on a surface thereof. For clarity, the active and/or passive devices (or regions) are not shown in the drawings, but are nevertheless meant to be included with substrate 2. For example, the substrate 2 may comprise any semiconductor material including, but not limited to: Si, Ge, SiGe, SiC, SiGeC, InAs, GaAs, InP and other III/V compound semiconductors. The substrate 2 may be undoped, or doped. In one example, the doping of Si-containing substrate may be light (having a dopant concentration of less than $1E17$ atoms/$cm^3$) or heavy (having a dopant concentration of about $1E17$ atoms/$cm^3$ or greater). The substrate 2 can have any crystallographic orientation such as (100), (110) or (111). Hybrid substrates having at least two planar surfaces of different crystallographic orientation are also contemplated.

In one embodiment, the device interconnect level 1 is formed atop the substrate 2 using deposition, etching and planarization. More specifically, in one embodiment of the invention, the first dielectric layer 15 is formed atop the substrate 2 by a deposition process including, for example, chemical vapor deposition (CVD), plasma-assisted CVD, evaporation, spin-on coating, or chemical solution deposition. The first dielectric layer 15 includes any suitable insulating material that is typically employed in interconnects to electrical devices. This includes inorganic dielectrics, organic dielectrics and combinations thereof, including, multilayers thereof. Illustrative examples of suitable materials for first dielectric layer 15 include, but are not limited to: $SiO_2$, fluorinated $SiO_2$, $Si_3N_4$, organic thermoset or thermoplastic dielectrics such as polyimides, polyarylenes, benzocyclobutenes and the like, spun-on glasses including organosilicate glass (OSG), with or without porosity, such as hydrogen silsesquixoane, methyl silsesquixoane, tetraethylorthosilicate (TEOS) and the like, amorphous alloys of Si, O, C and H, or SiCOH, amorphous alloys of Si, O, F and H.

In one embodiment, the first dielectric layer 15 comprises an oxide having a thickness ranging from about 10 nm to about 1000 mm. In another embodiment, the first dielectric layer 15 has a thickness ranging from about 25 nm to about 500 nm. In yet another embodiment, the first dielectric layer 15 has a thickness of the order of about 300 nm. In one embodiment, the dielectric constant of the first dielectric layer 15 may be less than about 3.5. In another embodiment, the first dielectric layer 15 may have a dielectric constant that ranges from about 1.0 to about 3.0. Low-k dielectrics may include organic dielectrics such as low dielectric constant polymer dielectrics or may include low dielectric constant carbon-doped oxides. One example of a low-k dielectric polymer dielectric is SiLK™ (trademark of The Dow Chemical Company). Specifically, SiLK™ is a class of polymer-based low-k dielectric materials comprising a b-staged polymer having a composition including about 95% carbon. An example of a low dielectric constant carbon doped oxide is SiCOH.

In one embodiment, a second dielectric layer 25 is deposited atop the first dielectric layer 15. Similar to the first dielectric layer 15, the second dielectric layer 25 may include any suitable insulating material that is typically employed in interconnects to electrical devices, so long as the composition of the second dielectric layer 25 may be differentiated from the first dielectric layer 15 for selective etch purposes. In one embodiment, when the first dielectric layer 15 is composed of an oxide, such as $SiO_2$, the second dielectric layer 25 is composed of a nitride, such as $Si_3N_4$. In one embodiment, the thickness of the second dielectric layer 25 may range from about 10 nm to about 100 nm. In one embodiment, the second dielectric layer 25 may be deposited by chemical vapor deposition (CVD) or physical vapor deposition (PVD). Additionally, the second dielectric layer 25 may be formed using a growth process, such as thermal oxide growth or nitridization.

Following the formation of the second dielectric layer 25, openings 10 are formed through the second dielectric layer 25 and the first dielectric layer 15 so as to expose portions of the underlying substrate 2, in which device interconnects, such as metal studs 20 and/or metal bars 30 are subsequently formed. For example, a lithographic step may include applying a photoresist to the second dielectric layer 25, exposing the photoresist to a pattern of radiation and developing the pattern into the exposed photoresist utilizing a resist developer. The etching step used in providing the openings 10 into first dielectric layer 15 may include chemical reactive ion etching (RIE), plasma etching, ion beam etching or laser ablation. Following etching, the photoresist is typically removed from the structure utilizing a resist stripping process, such as an oxygen ash. In one embodiment, the etch process may be a two stage etch, in which the first etch stage includes an etch chemistry for removing the second dielectric layer 25 selective to the first dielectric layer 15; and the second etch stage may include an etch chemistry to remove the first dielectric layer 15 selective to the second dielectric layer 25, wherein the previously etched second dielectric layer 25 acts as a mask for the second stage etch. In one embodiment, the width $W_1$ of the openings 10 ranges from about 20 nm to about 500 nm. Hereafter, the openings 10 described above are referred to as vias 10.

In one embodiment, device interconnects, such as metal studs 20 and bars 30, are then formed within the vias 10 in the first dielectric layer 15 using deposition and planarization processes. In one embodiment, a barrier liner is positioned between the device interconnect's via sidewalls, and the upper surface of the underlying substrate 2. In one embodiment, the barrier liner prevents the electromigration of a conductive metal into the first dielectric layer 15. In one embodiment, the barrier liner may be composed of a barrier metal, such as TiN or TaN.

Following the formation of the barrier liner, a conductive material, such as Cu or W, is then formed utilizing a deposition process, such as plating or sputtering, filling at least the vias 10. After filling the vias 10 with a conductive material, the structure is typically subjected to a planarization process, such as chemical-mechanical polishing or grinding, to provide a planar structure, as depicted in FIG. 1. Note that each top surface of conductive material, metal studs 20 and/or metal bars 30, is substantially coplanar with the abutting top surface of second dielectric layer 25.

Figure 2:
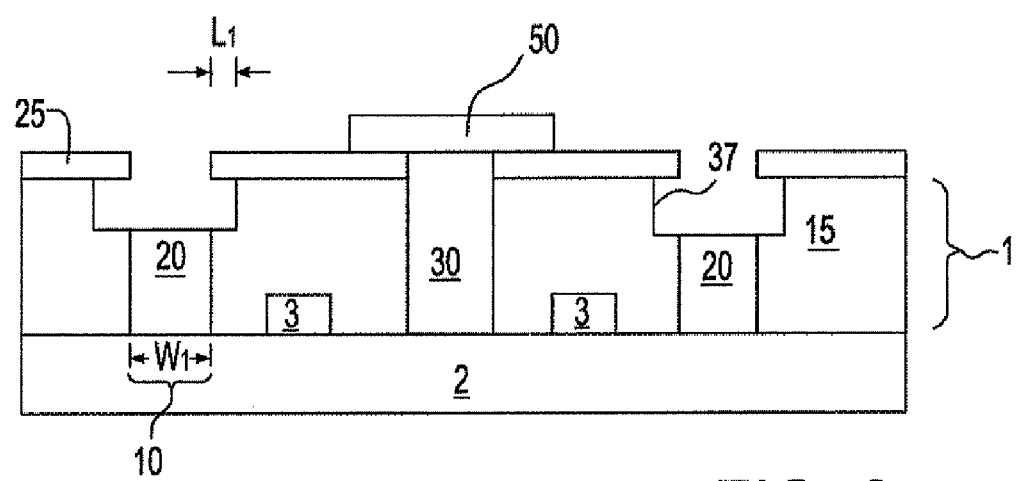
FIG. 2 is a side cross sectional view depicting recessing the upper surface of the metal stud below the upper surface of the first dielectric layer with an anisotropic etch, and then providing an undercut region in the first dielectric layer with an isotropic etch, in accordance with one embodiment of the present invention.

FIG. 2 is a side cross sectional view depicting recessing of the upper surface of the metal stud 20 below an upper surface of the first dielectric layer 15, and forming an undercut region 37 underlying the second dielectric layer 25, in accordance with one embodiment of the present invention. In one embodiment, a patterned photomask is formed atop the second dielectric layer 25 exposing the upper surface of the metal studs 20. In one embodiment, the patterned photomask is formed by depositing a layer of photoresist atop the substantially planar surface of the second dielectric layer 25 and metal studs 20, wherein following deposition of the layer of photoresist the resist is patterned to expose the metal studs 20 that are to be etched and to protect the remaining structure from the etchant. In one embodiment, a protective mask 50 is provided atop the metal bar 30.

Following photoresist patterning and development, the exposed portions of the metal studs 20 are etched using an anisotropic etch process, i.e., reactive ion etching, selective to the second dielectric layer 25. In one embodiment, the metal studs 20 are composed of tungsten (W) and the second dielectric layer 25 is composed of a nitride, wherein recessing the upper surface of the metal studs 20 includes reactive ion etch processing with a sulfur hexafluoride/oxygen/chlorine ($SF_6/O_2/Cl_2$) chemistry. In another embodiment in which the metal studs 20 are composed of copper (Cu) and the second dielectric layer 25 is composed of a nitride, recessing the upper surface of the metal studs 20 includes a chemical etch by ammonium persulfate ($NH_4$).

In one embodiment, the upper surface of the W metal studs 20 are recessed from about 80 nm to about 400 nm from the upper surface of the second dielectric layer 25. In another embodiment, the upper surface of the W metal studs 20 are recessed from about 90 nm to about 300 nm from the upper surface of the second insulating layer 25. In a further embodiment, the upper surface of the tungsten (W) metal studs 20 are recessed from about 100 nm to about 250 nm from the upper surface of the second insulating layer 25. In one embodiment, recessing the metal stud 20 below the upper surface of the first dielectric layer 15 exposes the sidewalls of the via 10 within the first dielectric layer 15, hence providing a cavity in the upper portion of the via 10. Following etch to recess the upper surface of the metal stud 20, the protective photomask 51 is removed.

Still referring to FIG. 2, in one embodiment, in a following process step the exposed sidewalls of the via 10 in the first dielectric layer 15 are selectively etched by a substantially isotropic etch step to produce an undercut region 37 extending beneath the second dielectric layer 25. In one embodiment, the undercut region 37 is formed in a portion of the via 10 sidewalls corresponding to the first dielectric layer 15. In one embodiment, the portion of the second dielectric layer 25 overlying the undercut portion 37 has a length $L_1$ ranging from about 5 nm to about 100 nm.

In one embodiment, the isotropic etch is an etch process in which the etch rate in a direction parallel to the upper surface of the second dielectric layer 25 is substantially the same as the etch rate in a direction perpendicular to the upper surface of the second dielectric layer 25. In one embodiment, the width $W_2$ of the undercut region 37 is greater than the width $W_1$ of the via 10. In one embodiment, the width $W_2$ of the undercut region 37 may range from about 25 nm to about 550 nm. In another embodiment, the width $W_2$ of the undercut region 37 may range from about 55 nm to about 350 nm. In yet another embodiment, the width $W_2$ of the undercut region 37 may range from about 110 nm to about 210 nm. In one embodiment, the height $H_1$ of the undercut region 37 may range from about 50 nm to about 370 nm. In another embodiment, the height $H_1$ of the undercut region 37 may range from about 60 nm to about 270 nm. In yet another embodiment, the height $H_1$ of the undercut region 37 may range from about 70 nm to about 220 nm.

In one embodiment, the substantially isotropic etch includes a wet etch. In one embodiment in which the first dielectric layer 15 is an oxide and the second dielectric layer 25 is a nitride, the wet etch chemistry includes a solution of hydrofluoric acid (HF). In another embodiment, the wet etch chemistry may include a hydrofluoric acid etch chemistry diluted with distilled water ($H_2O$) at a ratio of approximately 25:1 to approximately 500:1. In another embodiment in which the first dielectric layer 15 is an oxide and the second dielectric layer 25 is a nitride, the wet etch chemistry includes a buffered hydrofluoric acid (HF). In one embodiment, the buffered HF wet etch chemistry may include ammonium fluoride as a buffer, wherein the HF/buffer ratio may range from about 9:1 to about 50:1. In yet another embodiment, the wet etch chemistry may include HCl and peroxide. In yet a further embodiment, in addition to above described solutions, it is proposed that other inorganic acids and oxidizing agents can produce the same results so long as the etch chemistry does not attack the second dielectric layer 25. In one embodiment, the oxidizing agents may include peroxides, nitrates, nitrites, perchlorates, chlorates, chlorites, hypochlorites, dichromates, permanganates, persulfates or combinations thereof. The inorganic acids can include sulfuric acid, phosphoric acid or combinations thereof.

Figure 3:
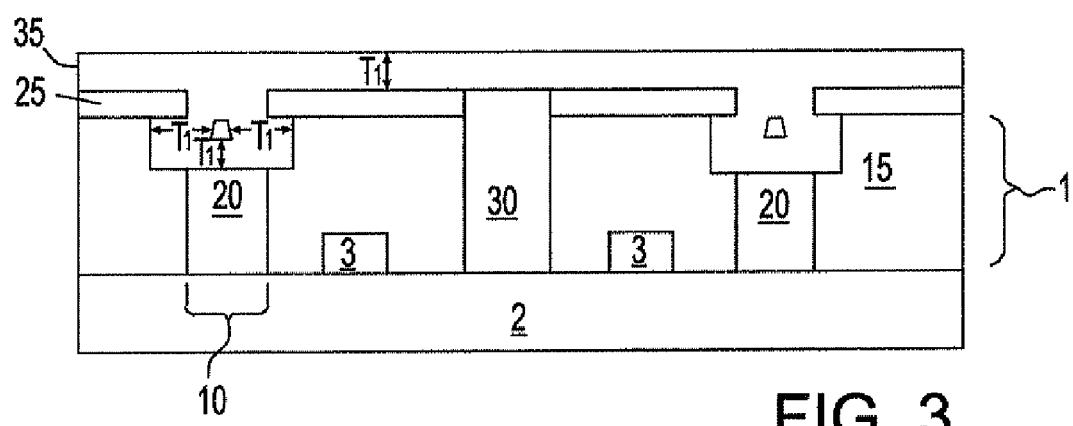
FIG. 3 is a side cross sectional view depicting forming a conformal insulating layer on at least the recessed surface of the metal stud and the undercut region, in accordance with at least one embodiment of the present invention.

FIG. 3 depicts one embodiment of forming a conformal insulating layer 35 on at least the upper surface the metal studs 20, the undercut region 37, and the portion of the second dielectric layer 25 overlying the undercut region 37, in accordance with the present invention. In one embodiment, the conformal insulating layer 35 is a deposited material having a thickness that remains the same regardless of the geometry of underlying features on which the layer is deposited, wherein the thickness of the layer does not deviate from greater than or less than 20% of an average value for the thickness of the layer. In one embodiment, the conformal insulating layer 35 is composed of an oxide, such as $SiO_2$.

In one embodiment, the conformal insulating layer 35 is deposited to a thickness at which the conformal insulating layer 35 positioned on the edges 38, 39 of the second dielectric layer 25 overlying the undercut region 37 at opposing sidewalls of the via 10 contact one another to enclose a cavity within the via 10, hence providing the keyhole 40. In one embodiment the keyhole 40 is a void enclosed in oxide positioned within the via 10 corresponding to the undercut region 37. In one embodiment, the diameter of the keyhole is approximately the difference between the width $W_2$ of the undercut region 37 and the width $W_1$ of the via 10. In one embodiment, the keyhole 40 has a diameter of sublithographic dimension. In one embodiment, the keyhole 40 may have a diameter ranging from about 5 nm to about 50 nm.

In one embodiment, the conformal insulating layer 35 may be deposited by chemical vapor deposition (CVD) or atomic layer deposition (ALD). Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. In one embodiment, the thickness $T_1$ of the conformal insulating layer 35 may range from about 5 nm to about 200 nm. In another embodiment, the thickness $T_1$ of the conformal insulating layer 35 may range from about 20 nm to about 400 nm. In yet another embodiment, the thickness $T_1$ of the conformal insulating layer 35 may range from about 30 nm to about 200 nm.

Figure 4:
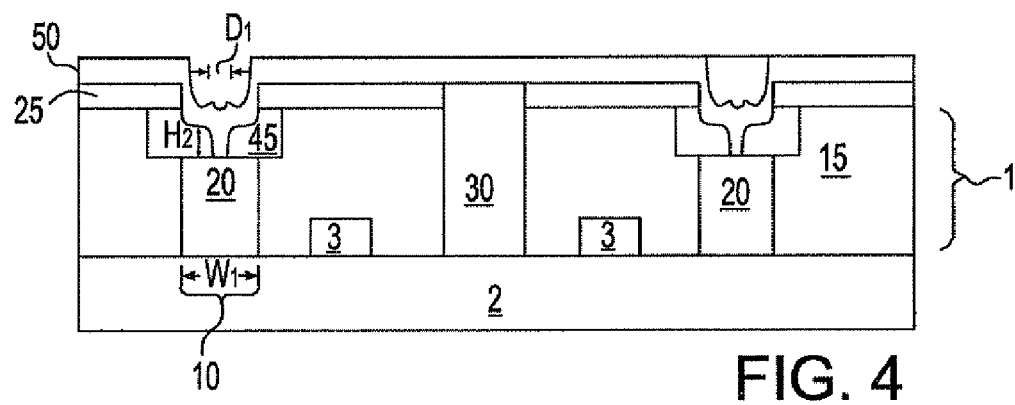
FIG. 4 is a side cross sectional view depicting forming a collar, and filling the collar with a first barrier metal to provide an electrode, in accordance with one embodiment of the present invention.

FIG. 4 depicts one embodiment of selectively etching the conformal insulating layer 35 with an anisotropic etch to provide a collar 45 that exposes the upper surface of at least one metal stud 20; and forming a barrier metal 50 in the collar 45 in electrical contact with a metal stud 20 to provide an electrode, in accordance with the present invention. In one embodiment, the anisotropic etch is an etch process in which the etch rate in the direction perpendicular to the plane of the etch surface is faster than the etch rate in the direction parallel to the etch surface. In one embodiment, the etch rate in the direction perpendicular to the plane of the etch surface is faster than the etch rate in the direction parallel to the etch surface by a factor of 100.

In one embodiment in which the conformal insulating layer 35 is an oxide, such as $SiO_2$, the second dielectric layer 25 is a nitride, such as $Si_3N_4$, and the metal stud 20 is composed of W, the anisotropic etch process includes a reactive ion etch including an $Ar/O_2/C_4F_8/N_2$ dual frequency capacitive coupled plasma chemistry with flow ratio at 50:1:2:10. It is noted that other etch chemistries are possible, so long as the etch chemistry removes the conformal insulating layer 35 selective to the second dielectric layer 25 and the metal stud 20.

In one embodiment, the keyhole 40 acts as a template during anisotropic etching of the conformal insulating layer 35 to produce a collar 45 of sublithographic dimensions that exposes the upper surface of the metal stud 20. In one embodiment, a sublithographic dimension equal to 40% of the minimum dimension that may be defined using photolithography. More specifically, the anisotropic etch removes the portion of the conformal insulation layer 35 corresponding to the ends 38, 39 of the second dielectric layer 25 that provide the upper portion of the keyhole 40, wherein the directional etch process continues through the void of the keyhole 40 until reaching the metal stud 20. The keyhole 40 accelerates etching to the metal stud 20 in comparison to the portions of the conformal insulating layer 35 within the undercut region 37 and adjacent to the keyhole 40, because the void of the keyhole 40 reduces the amount of oxide to be etched by the anisotropic etch step. In one embodiment, the anisotropic etch step may be timed. In another embodiment, the process is endpointed by exposing the dielectric 25 and adding an over etch.

In one embodiment, the collar 45 is composed of an oxide and has a diameter $D_1$ ranging from about 20 nm to about 100 nm. In another embodiment, the collar 45 has a sublithographic diameter $D_1$ ranging from about 15 nm to about 50 nm. In a further embodiment, the collar 45 has a sublithographic diameter $D_1$ ranging from about 10 nm to about 50 nm. In an even further embodiment, the collar 45 has a sublithographic diameter $D_1$ ranging from about 10 nm to about 30 nm. In one embodiment, the collar 45 is composed of an oxide and has a height $H_2$ ranging from about ranging from about 80 nm to about 200 nm. In another embodiment, the collar 45 has a height $H_2$ ranging from about 60 nm to about 150 nm. In a further embodiment, the collar 45 has a height $H_2$ ranging from about 40 nm to about 120 nm.

Still referring to FIG. 4, in one embodiment, following the formation of the collar 45, a first barrier metal 50 is blanket deposited by a conformal deposition process atop the second dielectric layer 25, and within the via 10 including within the collar 45. In one embodiment, the first barrier metal 50 within the collar 45 is in electrical contact with a metal stud 20. In one embodiment, the first barrier metal 50 may be composed of TiN or TaN or TaSiN. In one embodiment, the first barrier metal 50 may have a thickness ranging from about 10 nm to about 50 nm. In another embodiment, the first barrier metal 50 may have a thickness on the order of about 10 nm. In one embodiment, the first barrier metal 50 may be deposited by sputter deposition or plating. In another embodiment, the first barrier metal 50 may be deposited by Chemical Vapor Deposition (CVD) or Atomic Layer Deposition (ALD). Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. In one embodiment, the first barrier metal 50, in addition to providing the electrode material, prevents the electromigration of a conductive metal into the first insulating layer 25. In one embodiment, the first barrier metal 50 formed within the collar 45 provides an electrode to a later formed memory cell.

Figure 5:
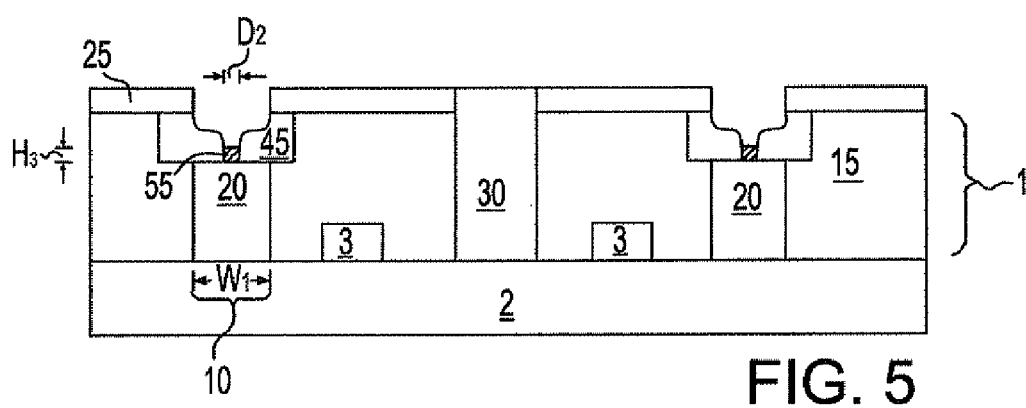
FIG. 5 is a side cross sectional view depicting etching the first barrier metal with an isotropic etch to provide an electrode, in accordance with one embodiment of the present invention.

FIG. 5 depicts one embodiment of an etch process for recessing the first barrier metal 50 within the collar 45. In one embodiment, the etch process is an isotropic etch, such as reactive ion etch, that removes the first barrier metal 50 selective to the second dielectric layer 25 and the conformal insulating layer 35/collar 45. In one embodiment in which the first barrier metal 50 is composed of TiN, the second dielectric layer 25 is a nitride, and the conformal insulating layer 35/collar 45 is an oxide, the isotropic etch process includes a reactive ion etch including a high density chlorine:Ar plasma having a ratio 1:1 producing a TiN etch rate of 30 A/ It is noted that other etch chemistries have been contemplated, so long as the etch chemistry removes the first barrier metal 50 selective to the second dielectric layer 25 and the conformal insulating layer 35.

In one embodiment, the etch process for recessing the first barrier metal 50 removes the first barrier metal 50 from the upper surface of the second dielectric layer 25 and the upper surface of the collar 45 within the via 10, wherein a remaining portion of the first barrier metal 50 remains in contact with the metal stud 20 and is contained within the collar 45. In one embodiment, the remaining portion of the first barrier metal 50 provides the electrical contact to a later formed memory cell, and is hereafter referred to as an electrode 55. In one embodiment, the electrode 55 may have sublithographic dimensions. In one embodiment, the electrode 55 may have a diameter $D_2$ ranging from about 20 nm to about 100 nm. In a further embodiment, the electrode 55 has a diameter $D_2$ ranging from about 10 nm to about 50 nm. In one embodiment, the electrode 55 has a height $H_3$ ranging from about ranging from about 70 nm to about 180 nm. In another embodiment, the electrode 55 has a height $H_3$ ranging from about 50 nm to about 140 nm. In a further embodiment, electrode 55 has a height $H_3$ ranging from about 300 nm to about 100 nm.

Following the formation of the electrode 55, a memory device for non-volatile or volatile memory may be provided in electrical contact with the electrode 55, wherein the memory device may include a resistive memory or phase change memory element.

Figure 6:
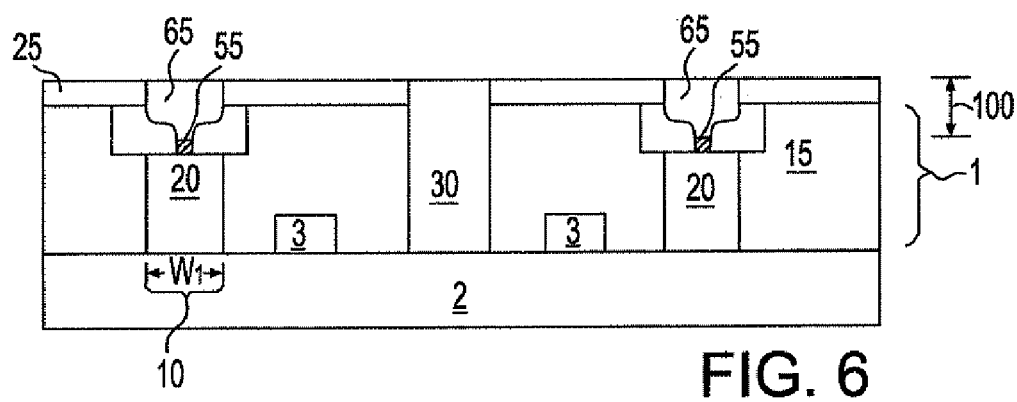
FIG. 6 is a side cross sectional view depicting forming a phase change memory material in electrical contact with the electrode, in accordance with one embodiment the present invention.
Figure 7:
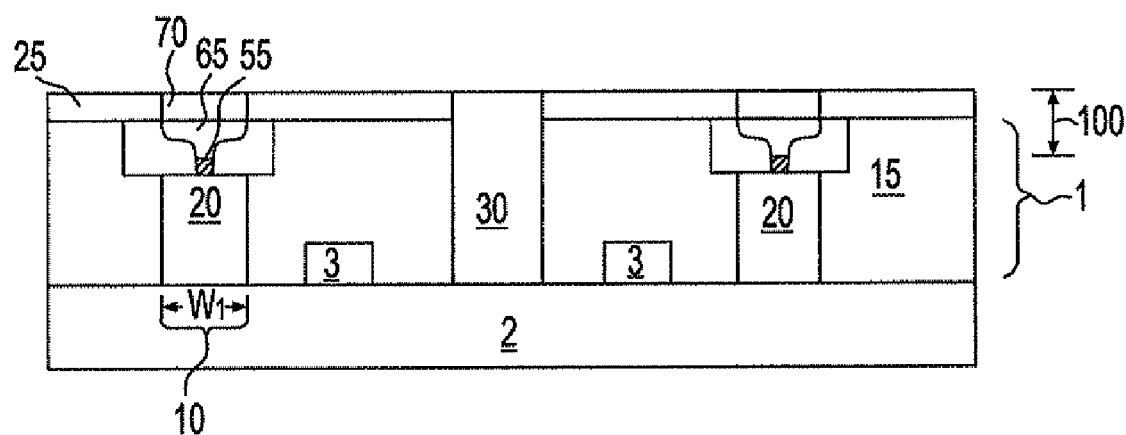
FIG. 7 is a side cross section view depicting forming a second barrier metal atop the phase change memory material, in accordance with one embodiment the present invention.

FIGS. 6 and 7 depict one embodiment of forming a phase change material memory cell 100 in electrical contact with an exposed upper surface of the electrode 55. It is noted that although the following disclosure is in reference to a phase change memory cell, any memory cell may be utilized with the above-described electrode 55 including but not limited to volatile memory, non-volatile memory, and resistive memory. FIG. 6 depicts one embodiment of forming a phase change material 65 of a phase change material memory cell 100 in electrical contact with the electrode 55. In one embodiment, depositing a phase change material 65 includes at least filling the via 10 with a phase change material 65. In one embodiment, the thickness of the phase change material 65 may range from about 80 nm to about 500 nm. In one embodiment, deposition of the phase change material 65 may include blanket deposition of the phase change material 65 followed by planarization to provide an upper surface of the phase change material 65 being substantially coplanar with the upper surface of the second insulating layer 25.

In one embodiment, the phase change material 65 may be switched from an amorphous phase to a crystalline phase. When in an amorphous state, the phase change material 65 is electrically insulating and functions similar to the gate dielectric of a metal oxide semiconductor field effect transistor (MOSFET). The term "chalcogenide" is used herein to denote an alloy or compound material, which contains at least one element from Group VI of the Periodic Table of Elements. Illustrative examples of chalcogenide alloys that can be employed herein include, but are not limited to, alloys of Te or Se with at least one of the elements of Ge, Sb, As, Si. In other embodiments, the phase change material is made of any suitable material including one or more of the elements Te, Ga, In, Se, and S. In one embodiment, the phase change material 65 has a composition of $Ge_2Sb_2Te_5$ (GST). Although chalcogenides are a group of materials commonly utilized as phase change material, some phase change materials, such as GeSb (GS), do not utilize, chalcogenides. Thus, a variety of materials can be used in the phase change material 65 so long as they can retain separate amorphous and crystalline states of distinct resistivity.

In one embodiment, a phase change material 65 composed of GST when at a temperature of about 25° C. is in an amorphous phase. As the temperature of the GST phase change material is increased to about 125° C., the resistivity of the phase change material decreases representing the transition temperature for a phase change from an amorphous phase to Face Center Cubic (FCC) phase. Further increases in the temperature of the GST phase change material 65 to greater than about 180° C. result in further decreases in resistivity, which result from a phase change from the Face Centered Cubic (FCC) phase to a Hexagonal (Hex) phase of the GST. When the temperature of the GST phase change material is increased above the melting temperature (620° C.), the GST phase change material melts and upon cooling, i.e. quench, returns to the amorphous solid phase. In one embodiment the phase change material 65 and the electrode 55 are both contained within the via 10, hence providing where the phase change material 65 and the electrode 55 are self aligned.

Referring to FIG. 7, in one embodiment of the present invention, a second barrier metal layer 70 is formed atop the phase change material 65. In one embodiment, prior to the formation of the second barrier/electrode metal 70, the phase change material 65 may be recessed within the via 10 by an anisotropic etch process, such as reactive ion etch. In one embodiment, the second barrier/electrode metal layer 70 may be composed of TiN TaN, TaSiN, TiTaN, TaRuN or combinations thereof. In one embodiment, the second barrier metal 70 is blanket deposited by a physical deposition process (PVD), such as sputtering. In another embodiment, the second barrier metal 70 may be deposited by chemical vapor deposition (CVD). In one embodiment, the layer of the second barrier metal 70 may have a thickness ranging from about 20 nm to about 300 nm. Following deposition, a planarization step may the to the second barrier metal 70 within the via 10 to provide an upper surface being substantially coplanar with the upper surface of the second insulating layer 25.

Figure 8:
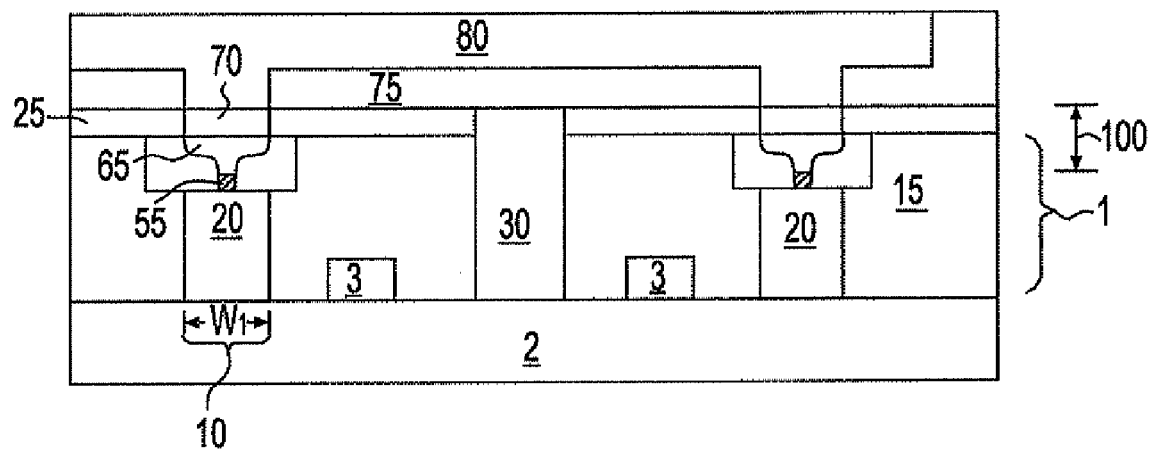
FIG. 8 is a side cross sectional view depicting forming conductive pathways, such as word lines and bit lines, in electrical communication with one embodiment of a phase change memory device, in accordance with the present invention.

Referring to FIG. 8, in one embodiment of the present method, following the formation of the second barrier metal layer 70, a layer of dielectric material 75 (hereafter referred to as blanket dielectric 75) is blanket deposited atop the structure depicted in FIG. 7. The blanket dielectric 75 may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon). Additional choices for the blanket dielectric 75 include: any of the aforementioned materials in porous form, or in a form that changes during processing to or from being porous and/or permeable to being non-porous and/or non-permeable.

The blanket dielectric 75 may be formed by various methods including, but not limited to: spinning from solution, spraying from solution, chemical vapor deposition (CVD), plasma enhanced CVD (PECVD), sputter deposition, reactive sputter deposition, ion-beam deposition, and evaporation. Following deposition the blanket dielectric may be planarized to provide a planar upper surface, wherein the planarization process may include chemical mechanical planarization (CMP).

The deposited blanket dielectric 75 is then patterned and etched to form via holes to the memory devices 100. Following via formation, interconnects 80 are formed by depositing a conductive metal into the via holes using conventional processing, such as CVD or plating. The conductive metal may include, but is not limited to: tungsten, copper, aluminum, silver, gold, and alloys thereof.

While the present invention has been particularly shown and described with respect to the preferred embodiments thereof, it will be understood by those skilled in the art that the foregoing and other changes in forms of details may be made without departing form the spirit and scope of the present invention. It is therefore intended that the present invention not be limited to the exact forms and details described and illustrated, but fall within the scope of the appended claims.

What is claimed:

1. A method of making a memory device comprising:
providing a first dielectric layer including at least one via containing a metal stud;
providing a second dielectric layer on the first dielectric layer, wherein an upper surface of the metal stud is exposed;
recessing the metal stud to expose a sidewall of the at least one via in the first dielectric layer;
etching the sidewall of the at least one via in the first dielectric layer by a substantially isotropic etch step to produce an undercut region extending beneath a portion of the second dielectric layer;

forming a conformal insulating layer on a recessed surface of the metal stud, the undercut region, and the portion of the second dielectric layer overlying the undercut region to provide a keyhole;

etching the conformal insulating layer with a substantially anisotropic etch, wherein the keyhole provides a mask to provide a collar that exposes the recessed surface of the metal stud;

forming a barrier metal within the collar in contact with the metal stud to provide an electrode; and forming a phase change material in contact with the electrode.

2. The method of claim 1, wherein the metal stud comprises tungsten.

3. The method of claim 1, wherein the recessing of the metal stud to expose the sidewall of the first dielectric layer includes an anisotropic etch step that removes the metal stud selective to the second dielectric layer.

4. The method of claim 1, wherein the first dielectric layer comprises an oxide and the second dielectric layer comprises a nitride.

5. The method of claim 1, wherein the phase change material is contained within the at least one via.

6. The method of claim 1, wherein a width of the metal stud ranges from about 20 nm to about 500 nm.

7. The method of claim 6, wherein the portion of the second dielectric layer overlying the undercut portion has a length ranging from about 5 nm to about 100 nm.

8. The method of claim 7, wherein the first dielectric layer comprises a thickness ranging from about 25 nm to about 500 nm.

9. The method of claim 7, wherein the conformal insulating layer comprises an oxide comprising a thickness ranging from about 5 nm to about 200 nm.

10. The method of claim 9, wherein the conformal insulating layer is deposited by chemical vapor deposition (CVD) or atomic layer deposition (ALD).

11. The method of claim 9, wherein the keyhole is a void enclosed in oxide positioned within the via corresponding to the undercut region of the first insulating layer.

12. The method of claim 1, wherein the collar is comprised of an oxide.

13. The method of claim 1, wherein the barrier metal comprises TiN or TaN.

14. The method of claim 1, wherein the forming of the barrier metal comprises chemical vapor deposition or sputtering.

15. The method of claim 1, wherein the phase change material comprises a chalcogenide alloy.

16. The method of claim 1 further comprising forming a second barrier metal layer on an upper surface of the phase change material.

17. The method of claim 16, wherein the second barrier metal layer comprises TiN TaN, TaSiN, TiTaN, TaRuN or combinations thereof.

* * * * *